US012081177B2

United States Patent
Ochi et al.

(10) Patent No.: US 12,081,177 B2
(45) Date of Patent: Sep. 3, 2024

(54) BRIDGED CLASS-D RF AMPLIFIER CIRCUIT

(71) Applicants: Analog Power Conversion LLC, Bend, OR (US); Kyosan Electric Manufacturing Co., Ltd., Yokohama (JP)

(72) Inventors: Sam Seiichiro Ochi, Lakewood Ranch, FL (US); Dumitru Gheorge Sdrulla, Bend, OR (US); W. Albert Gu, Bend, OR (US); Tetsuya Takata, Yokohama (JP); Itsuo Yuzurihara, Yokohama (JP); Tomohiro Yoneyama, Yokohama (JP); Yu Hosoyamada, Yokohama (JP)

(73) Assignees: Analog Power Conversion LLC, Bend, OR (US); Kyosan Electric Manufacturing Co., Ltd., Yokohama (JP)

( * ) Notice: Subject to any disclaimer, the term of this patent is extended or adjusted under 35 U.S.C. 154(b) by 403 days.

(21) Appl. No.: 17/475,234

(22) Filed: Sep. 14, 2021

(65) Prior Publication Data

US 2023/0080752 A1    Mar. 16, 2023

(51) Int. Cl.
*H03F 3/217* (2006.01)

(52) U.S. Cl.
CPC ....... *H03F 3/217* (2013.01); *H03F 2200/451* (2013.01)

(58) Field of Classification Search
CPC .... H03F 3/217; H03F 2200/451; H03F 1/086; H03F 3/189; H03F 3/2173

USPC .......................................................... 330/251
See application file for complete search history.

(56) References Cited

U.S. PATENT DOCUMENTS

| | | | |
|---|---|---|---|
| 2007/0139103 | A1 | 6/2007 | Roeckner et al. |
| 2012/0139639 | A1 | 6/2012 | Scott et al. |
| 2016/0142018 | A1 | 5/2016 | Williams |
| 2021/0050819 | A1 | 2/2021 | Wang |

FOREIGN PATENT DOCUMENTS

KR    100796319 B1    1/2008

OTHER PUBLICATIONS

International Search Report and Written Opinion for related PCT/US2022/043145, mailed Jan. 4, 2023.

*Primary Examiner* — Andrea Lindgren Baltzell
*Assistant Examiner* — Khiem D Nguyen

(57) ABSTRACT

A full-bridge class-D amplifier circuit comprises first through fourth power devices. First conduction terminals of the first and third power devices are coupled to a first power supply voltage, and second conduction terminals of the second and fourth power devices are coupled to a second power supply voltage. A second conduction terminal of the first power device and a first conduction terminal of the second power device are coupled to a first amplifier output. A second conduction terminal of the third power device and a first conduction terminal of the fourth power device are coupled to a second amplifier output. Left and right driver devices respectively disposed adjacent to left and right sides of the first power device have outputs respectively coupled to left and right control terminals respectively disposed on the left and right sides of the first power device.

21 Claims, 5 Drawing Sheets

BRIDGED CLASS-D RF AMPLIFIER CIRCUIT

BACKGROUND

Class D amplifiers produce an analog output signal by switching one or more power switching devices (such as power Metal Oxide Semiconductor Field Effect Transistors (MOSFETs)) on and off at a frequency higher than the frequencies in the analog output signal to produce a digitally-modulated signal (such as a pulse-width modulated (PWM) signal or pulse-frequency modulated (PFM) signal). The digitally-modulated signal is then filtered (such as by using a low-pass filter) to produce the analog output signal.

A Class D amplifier may include driver devices that provide respective control signals to control terminals of the power switching devices. The connections between the driver devices and the power switching devices will have parasitic inductances and resistances.

The parasitic inductances and resistances of the connections between the driver devices and the power switching devices may limit the frequency at which the power switching devices may be switched, which may limit the maximum frequency of the analog output signal.

SUMMARY OF THE INVENTION

Embodiments relate to radio frequency (RF) amplifiers, and in particular to class-D RF amplifiers, including full-bridge class-D RF amplifiers using high bandgap semiconductor power devices.

In an embodiment, a class-D amplifier circuit comprises a circuit board, a first amplifier output, and a second amplifier output. A first power device is disposed on the circuit board and comprises a left control terminal, a right control terminal, and first and second conduction terminals. Second, third, and fourth power devices are also disposed on the circuit board and each comprise respective first and second conduction terminals. A first left driver device is disposed adjacent to the left side of the first power device and is coupled to the left control terminal of the first power device. A first right driver device is disposed adjacent to the right side of the first power device and is coupled to the right control terminal of the first power device, The first conduction terminal of the first power device and the first conduction terminal of the third power device are coupled to a first power supply voltage. The second conduction terminal of the first power device and the first conduction terminal of the second power device are coupled to the first amplifier output. The second conduction terminal of the second power device and the second conduction terminal of the fourth power device are coupled to a second power supply voltage. The second conduction terminal of the third power device and the first conduction terminal of the fourth power device are coupled to the second amplifier output.

DETAILED DESCRIPTION

Embodiments of the present application relate to full-bridge class-D RF amplifiers, such as full-bridge class-D RF amplifiers that use high bandgap semiconductor switching devices (such as silicon carbide (SiC) MOSFETs) in the legs of the bridge that forms the output stage. In particular, embodiments include a plurality of driver devices disposed adjacent to respective sides of each switching device, respectively connected to control and/or conduction terminal contacts (such as gate pads and/or source pads) disposed near the side of the switching device that each driver device is adjacent to. Embodiments described herein may describe the contacts used for electrical connections to a device as "pads," but embodiments are not limited thereto, and in embodiments the contacts may be, for example, pillars, bumps, balls, pins, leads, or combinations thereof.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Embodiments herein are described that use switching devices that include an SiC n-channel VMOSFET, but embodiments are not limited thereto. In embodiments, the switching devices may instead include an Insulated Gate Bipolar Transistor (IGBT), or any voltage controlled power semiconductor. In embodiments, the switching devices may include a p-channel device. In embodiments, the switching devices may be fabricated from a semiconductor material other than SiC.

Figure 1:
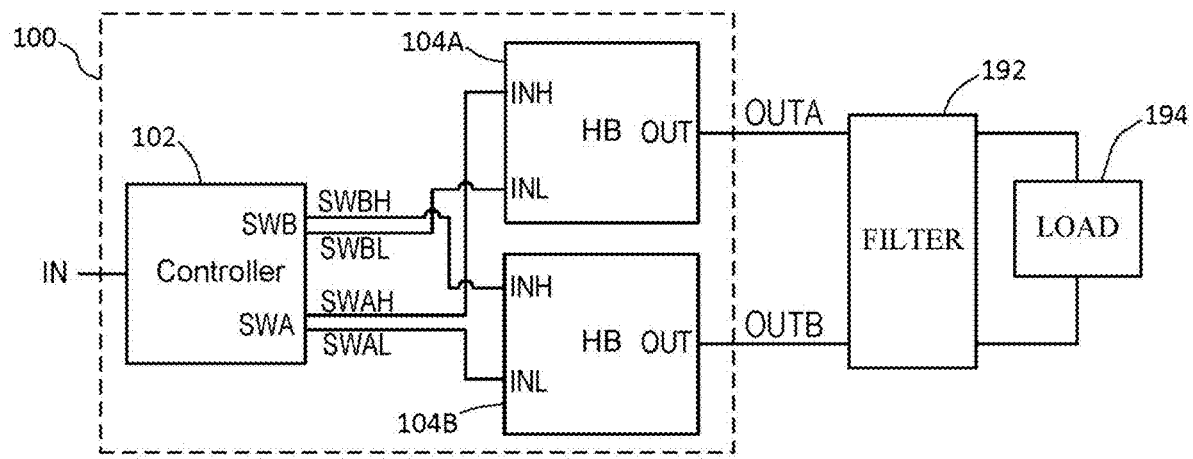
FIG. 1 illustrates a full-bridge class-D amplifier circuit according to an embodiment.

FIG. 1 illustrates a full-bridge class-D amplifier circuit 100 (hereinafter, amplifier 100) according to an embodiment. The amplifier 100 receives a pulse-modulated ((for example, a PWM or PFM) input signal IN and provides current to a load 194 through a filter 192 according to the input signal IN. The amplifier 100 includes a controller circuit 102, a first half-bridge circuit 104A, and a second half-bridge circuit 104B.

The controller circuit 102 produces first and second switching signals SWA and SWB according to the input signal IN. In an embodiment, the first switching signals SWA is asserted by the controller circuit 102 (that is, driven to a level corresponding to "ON") while the input signal IN has a first level (such as a level corresponding to a binary 1), and de-asserted (that is, driven to a level corresponding to "OFF") otherwise. The second switching signals SWA is asserted by the controller circuit 102 while the input signal IN has a second level (such as a level corresponding to a binary 0), and de-asserted otherwise. In embodiments, the controller circuit 102 inserts a small dead time between assertions of the first and second switching signals SWA and SWB to ensure that a switch is not turned on by one of them at the same time that another switch is (still) turned on by the other of them.

Each of the first and second half-bridge circuit 104A and 104B operate to source current to their output OUT when their high input INH is asserted and to sink current from the output OUT when their low input INL is asserted.

The first switch signal SWA includes a first switch signal high signal SWAH that is electrically coupled to the high input INH of the first half-bridge circuit 104A and a first switch signal low signal SWAL that is coupled to the low input INL of the second bridge circuit 104B. The second switch signal SWB includes a second switch signal low signal SWBL that is electrically coupled to the low input INL of the first half-bridge circuit 104A and a second switch signal high signal SWBH that is coupled to the high input INH of the second bridge circuit 104B. Accordingly, when the input signal IN has the first level, the first half-bridge circuit 104A sources current to an amplifier output OUTA coupled to a first terminal of the load 194 and the second half-bridge circuit 104B sinks current from an amplifier output OUTB coupled to a second terminal of the load 194, and when the input signal IN has the second level, the first half-bridge circuit 104A sinks current from the amplifier output OUTA and the second half-bridge circuit 104B sources current to the amplifier output OUTB.

In embodiments, the input signal IN may be switched at a frequency substantially higher than a desired frequency output to the load. In embodiments, the input signal IN may be switched at a frequency corresponding to the desired frequency output to the load but produce higher frequency harmonics in the signals output by the half-bridge circuits 104A and 104B. Accordingly, in embodiments, the filter 192 operates to attenuates frequencies in the outputs of the half-bridge circuits 104A and 104B that are higher than desired frequency. The filter 192 may include a low pass filter, a band-pass filer, or combinations thereof. The filter 192 may comprise an inductor, a capacitor, or a combination thereof.

Figure 2:
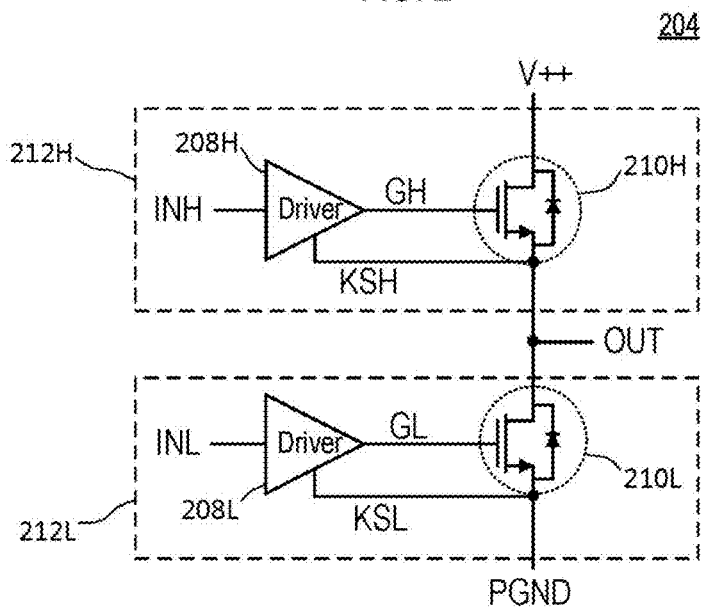
FIG. 2 illustrates a half-bridge circuit for use in the full-bridge class-D amplifier circuit of FIG. 1 according to an embodiment.

FIG. 2 illustrates a half-bridge 204 of an output stage of a class D amplifier circuit according to an embodiment. The half-bridge 204 may be included in one or both of the half-bridge 104A and the half-bridge 104B of the full-bridge class-D amplifier 100 of FIG. 1.

The half-bridge 204 includes a high leg 212H and a low leg 212L. The high leg 212H receives a high input signal INH and the low leg 212 receives a low input signal INL. Outputs of the high and low legs 212H and 212L are coupled together to produce an output signal OUT.

The high leg 212H includes a driver circuit 208H and a switching device 210H. In embodiments, the switching device 210H is a Silicon Carbide (SiC) VMOSFET power device. In an embodiment, the SiC has a 4H polytype. In an embodiment, the switching device 210H is a SiC VMOSFET power device with an integrated SiC Schottky barrier diode (SBD), as shown in FIG. 2. In other embodiments, the switching device 210H may be a SiC VMOSFET power device coupled to an external diode, such as an external SiC SBD.

A gate output GH of the driver circuit 208H controls a control terminal (in FIG. 2, a gate) of the switching device 210H according to the high input signal INH. A high-leg Kelvin source connection KSH is connected between the driver circuit 208H and a second conduction terminal (in FIG. 2, a source) of the switching device 210H. The high-leg Kelvin source connection KSH may provide a direct low-inductance return paths for current flowing between the gate output GH of the driver circuit 208H and a control terminal capacitance (here, a gate-source capacitance) of the switching device 210H. For example, when the driver circuit 208H produces the gate output GH signal on a drain terminal of a MOSFET, the high-leg Kelvin source connection KSH may electrically couple the source terminal of that MOSFET to the second conduction terminal of the switching device 210H.

A first conduction terminal (here, a drain) of the switching device 210H is coupled to a positive supply voltage V++. In an embodiment, the positive supply voltage V++ may have a voltage value of 300 or more volts. The second conduction terminal of the switching device 210H is coupled to the output signal OUT, so that the high leg 212H may source current to the output signal OUT when the high input signal INH is asserted.

The low leg 212L includes a driver circuit 208L and a switching device 210L. In embodiments, the switching device 210L is a Silicon Carbide VMOSFET power device. In an embodiment, the switching device 210L may be a Silicon Carbide VMOSFET power device with an integrated SiC SBD, as shown in FIG. 2. In other embodiments, the switching device 210L may be SiC VMOSFET power device coupled to an external diode, such as an external SiC SBD.

A gate output GL of the driver circuit 208L controls a control terminal (in FIG. 2, a gate) of the switching device 210L according to the high input signal INL. A low-leg Kelvin source connection KSL is connected between the driver circuit 208L and a second conduction terminal (in FIG. 2, a source) of the switching device 210L. The low-leg Kelvin source connection KSL may provide a direct low-inductance return paths for current flowing between the gate output GL of the driver circuit 208L and a control terminal capacitance (here, a gate-source capacitance) of the switching device 210L. For example, when the driver circuit 208L produces the gate output GL signal on a drain terminal of a MOSFET, the low-leg Kelvin source connection KSL may electrically couple the source terminal of that MOSFET to the second conduction terminal of the switching device 210L.

The second conduction terminal of the switching device 210L is coupled to a power ground PGND. A first conduction terminal (here, a drain) of the switching device 210L is coupled to the output signal OUT, so that the low leg 212L may sink current from the output signal OUT when the low input signal INL is asserted.

Figure 3:
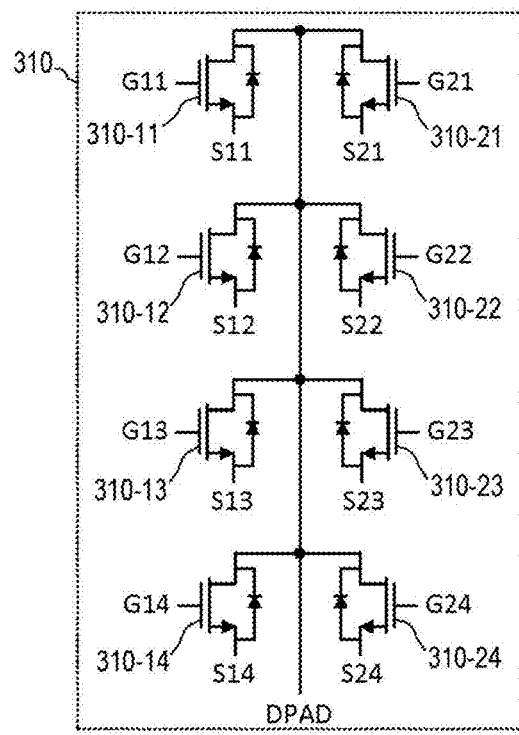
FIG. 3 illustrates a circuit corresponding to a VMOSFET power device according to an embodiment.

FIG. 3 illustrates a circuit corresponding to a VMOSFET power device 310 according to an embodiment. The VMOSFET power device 310 may correspond to the switching device 210H or the switching device 210L of FIG. 2.

The VMOSFET power device 310 includes first left active region 310-11 having a gate pad G11 connected to a gate of a respective MOSFET and a source pad S11 connected to a source of that MOSFET, and a first right active region 310-21 having a gate pad G21 connected to a gate of a respective MOSFET and a source pad S11 connected to a source of that MOSFET. The VMOSFET power device 310 further includes similarly-configured second left and right active regions 310-12 and 310-22 having respective gate pads G12 and G22 and source pads S12 and S22, third left and right active regions 310-13 and 310-23 having respective gate pads G13 and G23 and source pads S13 and S23, and fourth left and right active regions 310-14 and 310-24 having respective gate pads G14 and G24 and source pads S14 and S24. Drains of the MOSFETs in the active regions 310-11 through 310-24 are all connected to a drain pad DPAD formed on the bottom of the VMOSFET power device 310. The MOSFETs in the active regions 310-11 through 310-24 correspond to cells of the VMOSFET power device 310.

The VMOSFET power device 310 is illustrated as including eight active regions 310-11 through 310-24 each corresponding to a cell, and each cell is illustrated as including a MOSFET and corresponding diode, but embodiments are not limited thereto. The number of source and gate pads is left at the liberty of the designer, and is related to design constraints such as frequency of operation and the output current. Embodiments include source pads on both the left and right sides of the die and of the package (if any) that the die is provided in, so that connections to the source pads (such as connections to a ground plane and/or connections to Kelvin source connections of a driver device) may have the lowest possible stray inductances and the lowest possible resistances. Embodiments may also include gate pads on both the left and right sides of the die and of the package (if any) that the die is provided in, so that connections to the gate pads (such as connections to an output of a driver device) may have the lowest possible stray inductances.

Figure 4:
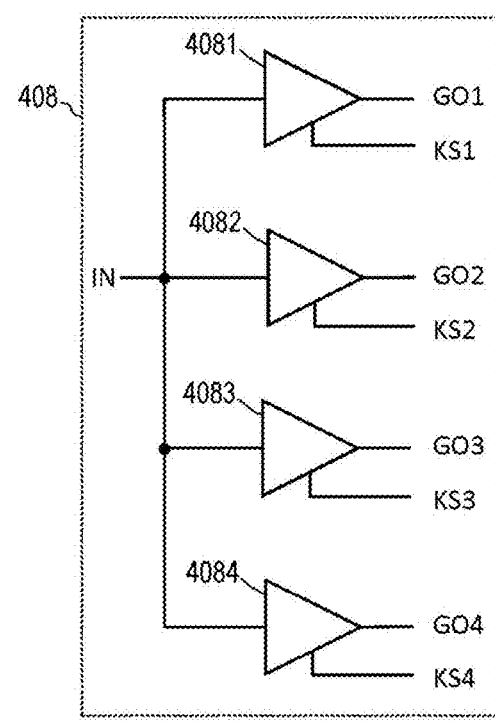
FIG. 4 illustrates a circuit corresponding to a driver device according to an embodiment.

FIG. 4 illustrates a circuit corresponding to a driver device 408 according to an embodiment. The driver device 408 may be included in the high driver circuit 208H or the low driver circuit 208L of FIG. 2.

The driver device 408 includes first subdriver circuit 4081, a second subdriver circuit 4082, a third subdriver circuit 4083, and a fourth subdriver circuit 4084. The first, second, third, and fourth subdriver circuits 4081, 4082, 4083, and 4084 respectively include first, second, third, and fourth gate outputs GO1, GO2, GO3, and GO4 and first, second, third, and fourth Kelvin source connections KS1, KS2, KS3, and KS4. Inputs of the first, second, third, and fourth subdriver circuits 4081, 4082, 4083, and 4084 are all electrically coupled to an input terminal IN.

Power supply connections for the driver device 408 and the included subdriver circuits are not shown in the interest of clarity.

Figure 5A:
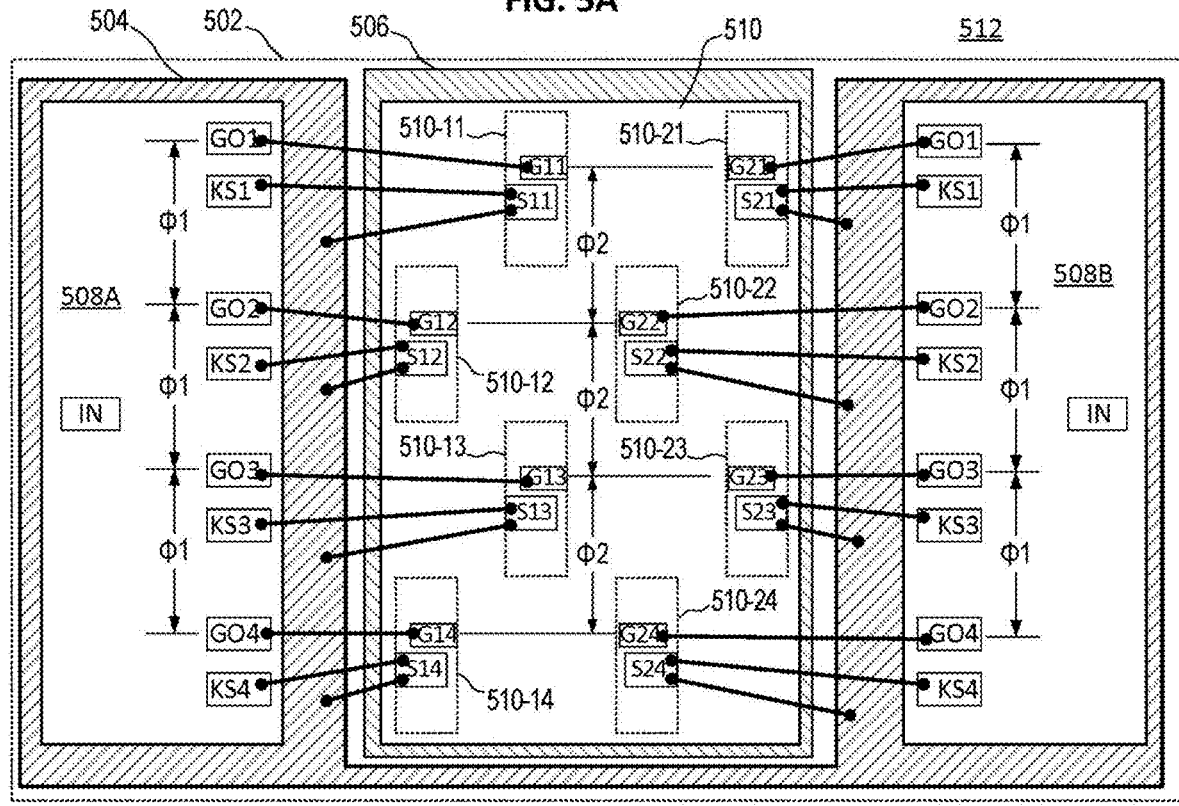
FIG. 5A illustrates a plan view of a circuit suitable for use as a leg of a full-bridge amplifier output stage according to an embodiment.

FIG. 5A illustrates a plan view of a circuit 512 according to an embodiment. The circuit 512 may be used in the high leg 212H or the low leg 212L of the half-bridge 204 of an output stage of a full-bridge class D amplifier circuit shown in FIG. 2, but embodiments are not limited thereto.

The circuit 512 including left and right driver devices 508A and 508B coupled to a VMOSFET power device 510 according to an embodiment. The left and right driver devices 508A and 508B may each include electrical circuitry corresponding to that shown for the driver device 408 of FIG. 4, and together may correspond to the driver circuit 208H or the driver circuit 208L of FIG. 2. The VMOSFET power device 510 may include electrical circuitry corresponding to that shown for the VMOSFET power device 310 of FIG. 3, and may correspond to the switching device 210H or the switching device 210L of FIG. 2.

First, second, third, and fourth left gate pads G11, G12, G13, and G14 respectively corresponding to first, second, third, and fourth left active regions 510-11, 510-12, 510-13, and 510-14 of the VMOSFET power device 510 are respectively connected (for example, by bond wires) to first, second, third, and fourth gate outputs GO1, GO2, GO3, and GO4 of the left driver device 508A. First, second, third, and fourth left source pads S11, S12, S13, and S14 respectively corresponding to the first, second, third, and fourth left active regions 510-11, 510-12, 510-13, and 510-14 of the VMOSFET power device 510 are respectively electrically connected (for example, by bond wires) to first, second, third, and fourth Kelvin source connections KS1, KS2, KS3, and KS4 of the left driver device 508A. The first, second, third, and fourth left source pads S11, S12, S13, and S14 are also electrically connected (for example, by bond wires other than those used to connect the left source pads to their respective Kelvin source connections) to a source plane 504 comprising a conductive material (such as copper, aluminum, or the like).

First, second, third, and fourth right gate pads G21, G22, G23, and G24 respectively corresponding to first, second, third, and fourth right active regions 510-21, 510-22, 510-23, and 510-24 of the VMOSFET power device 510 are respectively connected (for example, by bond wires) to first, second, third, and fourth gate outputs GO1, GO2, GO3, and GO4 of the right driver device 508B. First, second, third, and fourth right source pads S21, S22, S23, and S24 respectively corresponding to the first, second, third, and fourth right active regions 510-21, 510-22, 510-23, and 510-24 of the VMOSFET power device 510 are respectively electrically connected (for example, by bond wires) to first, second, third, and fourth Kelvin source connections KS1, KS2, KS3, and KS4 of the right driver device 508B. The first, second, third, and fourth left source pads S11, S12, S13, and S14 are also electrically connected (for example, by bond wires other than those used to connect the right source pads to their respective Kelvin source connections) to the source plain 504.

For each of the left and right driver devices 508A and 508B, the Kelvin source wiring that connects the Kelvin source connections KS1 through KS4 to the corresponding source pads S11 through S14 and S21 through S24 of the VMOSFET power device 510 provide isolation for the VMOSFET power device 510 and the left and right driver devices 508A and 508B, and the proximity of the connections between the gate outputs GO1 through GO4 and the gate pads G11 through G14 and G21 through G24 of the VMOSFET power device 510 and the Kelvin source wiring forms a differential-mode low-impedance (that is, low inductive) path that aides in the suppression of over- and under-voltages on the gates of the VMOSFET power device 510. Because the gates of the VMOSFET power device 510 are vulnerable to over- and under-voltages, suppression of the over- and under-voltages results in significant improvement in the reliability of the VMOSFET power device 510. Thick bond wires are used to connect the source pads S11 through S14 and S21 through S24 of the VMOSFET power device 510 to the source plane 504 disposed on the insulating layer 502 to reduce source inductance and resistance of the VMOSFET power device 510. The distributed source pads S11 through S14 and S21 through S24 further reduce the overall source inductance of the VMOSFET power device 510 for improved power capability.

A drain connection (not shown) on the bottom side (that is, a side of the die opposite a side that the gate and source pads are disposed on) of the VMOSFET power device 510 is electrically connected to a drain plane 506 comprising a conductive material. Power supply connections and connection to the input terminals of the left and right driver devices 508A and 508B are not shown in the interest of clarity.

The gate outputs GO1 through GO4 of each of the left and right driver devices 508A and 508B are vertically spaced according to a first pitch Φ1. The Kelvin source connections KS1 to KS4 of each of the left and right driver devices 508A and 508B may also be vertically spaced according to the first pitch 11.

The left gate pads G11 through G14 of the VMOSFET power device 510 are vertically spaced according to a second pitch Φ2. The right gate pads G21 through G24 are also vertically spaced according to the second pitch Φ2. The left source pads S11 through S14 may also be vertically spaced according to the second pitch Φ2, and the right source pads S21 through S24 may also be vertically spaced according to the second pitch Φ2.

The first pitch Φ1 may be the same or similar to the second pitch Φ2. For example, in an embodiment the first pitch Φ1 may be within 10% of the second pitch Φ2. In another embodiment, a distance between the upper-most and lower-most gate outputs of a driver device having N gate outputs vertically spaced according to the first pitch Φ1, i.e., (N−1) Φ1, may be greater than or equal to N−2 times the second pitch Φ2 and less than or equal to N times the second pitch Φ2, that is:

$$\frac{N-2}{N-1}\Phi 2 < \Phi 1 < \frac{N}{N-1}\Phi 2 \qquad \text{Equation 1A}$$

so that the driver devices 508A and 508B and the VMOSFET power device 510 may be positioned so that all gate outputs are vertically displaced no more than one-half the second pitch Φ2 from their corresponding gate pads. More generally, in an embodiment where the maximum allowable vertical displacement between the gate outputs and their corresponding gate pads is expressed as a fraction k of the second pitch Φ2, k greater than 0, the first pitch Φ1 satisfies:

$$\frac{N-1-2k}{N-1}\Phi 2 < \Phi 1 < \frac{N-1+2k}{N-1}\Phi 2 \qquad \text{Equation 1B}$$

Because a first pitch Φ1 is the same or close to a second pitch Φ2, variations between the respective lengths of the bond wires connecting the subdrivers of the left and right driver devices 508A and 508B to respective active regions of the VMOSFET power device 510 may be reduced, the length of the longest of those bond wires may be reduced, and accordingly parasitic inductances may be reduced and/or made more similar for each of the active regions.

Figure 5B:
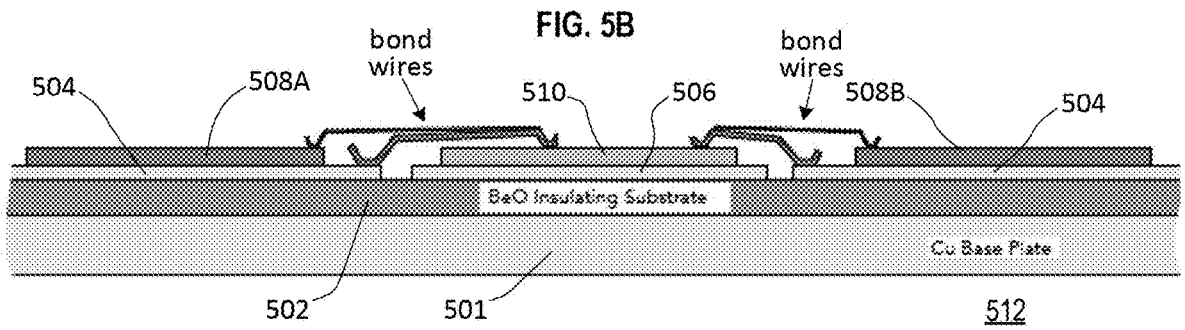
FIG. 5B illustrates a cross-section of the circuit shown in FIG. 5A according to an embodiment.

FIG. 5B illustrates a cross-section of circuit 512 shown in FIG. 5A according to an embodiment.

The left and right driver devices 508A and 508B are mounted on the source plane 504, and the VMOSFET power device 510 is mounted on the drain plane 506. The source plane 504 and the drain plane 506 are disposed on a circuit board including an electrically insulating layer 502. In the illustrated embodiment, the electrically insulating layer 502 comprises beryllium oxide (BeO), which has high thermal conductivity, but embodiments are not limited thereto.

As shown in FIG. 5B, in embodiments the bond wires that connect the source pads of the VMOSFET power device 510 to the source plane 504 may be heavier than the bond wires used to connect the source pads to the Kelvin source connections of the left and right driver devices 508A and 508B. In another embodiments, the source pads may each be connected to the source plane 504 using a plurality of bond wires.

The electrically insulating layer 502 may be disposed on a base plate 501 having high electrical and thermal conductivity. In the illustrated embodiment, the base plate 501 comprises copper (Cu), but embodiments are not limited thereto.

The circuit 512 reduces parasitic properties (such as parasitic inductance) that may reduce performance of the circuit 512 by:

1. providing multiple source pads S11 through S14 and S21 through S24 for the VMOSFET power device 510 and connecting them, using a first plurality of bond wires, to a nearby virtual ground comprising the source plane 504 and, using a second plurality of bond wires, to the Kelvin source connections KS1 and the KS4 of each of the left and right driver devices 508A and 508B to minimize parasitic inductances of the source connections,
2. providing multiple gate pads G11 through G14 and G21 through G24 for the VMOSFET power device 510 and connecting them to respective gate outputs GO1 through GO4 of each of the left and right driver devices 508A and 508B to minimize parasitic inductances of the source connections,
3. disposing the left source pads S11 through S14 and the left gate pads G11 through G14 on the left side of the VMOSFET power device 510 and connecting them to the left driver device 508A disposed adjacent to the left side of the VMOSFET power device 510, and disposing the right source pads S21 through S24 and the right gate pads G21 through G24 on the right side of the VMOSFET power device 510 and connecting them to the right driver device 508B disposed adjacent to the right side of the VMOSFET power device 510 to minimize parasitic inductances of the gate and source connections and to minimize parasitic inductances internal to the VMOSFET power device 510.
4. matching pad pitches of the left and right driver devices 508A and 508B and the VMOSFET power device 510 to reduce the parasitic inductances, and to reduce the variation among the parasitic inductances so that the cells of the VMOSFET power device 510 operate more consistently.

As a result of these features, in an embodiment gate and source inductances of the circuit 512 may be less than 0.1 nanohenries (nH) and the frequency of operation of the circuit 512 may exceed 100 MHz.

Figure 6A:
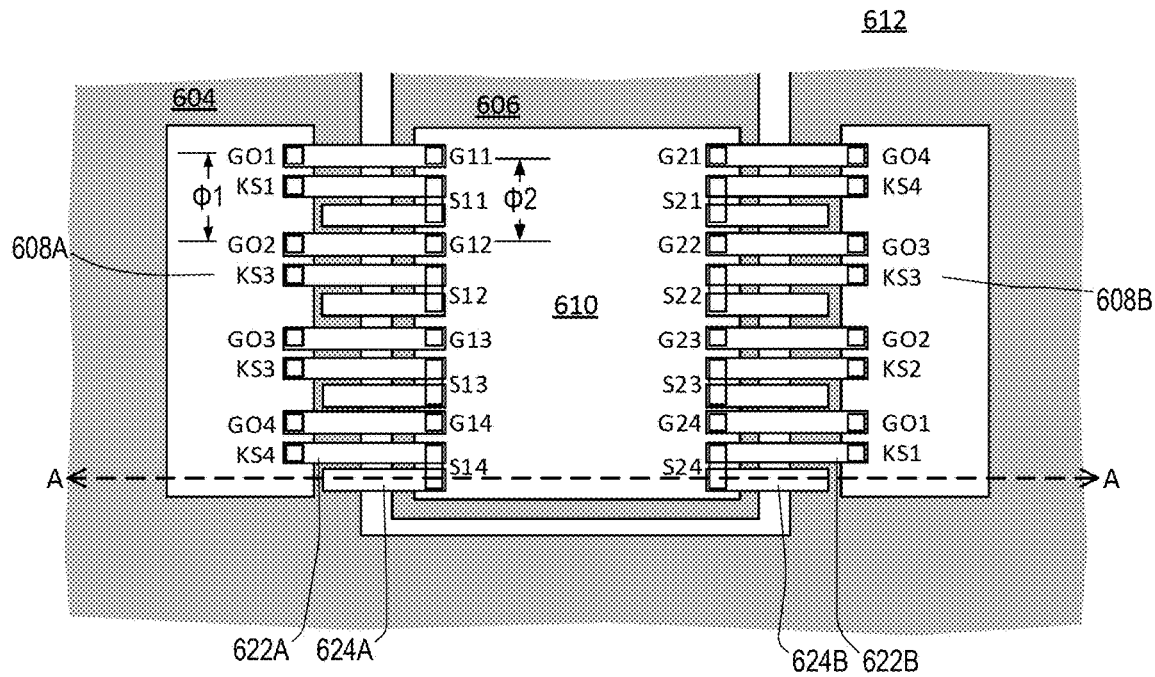
FIG. 6A illustrates a plan view of a circuit suitable for use as a leg of a full-bridge amplifier output stage according to an embodiment.

FIG. 6A illustrates a plan view of a circuit 612 according to an embodiment. The circuit 612 may be used in the high leg 212H or the low leg 212L of the half-bridge 204 shown in FIG. 2 of an output stage of a full-bridge class D amplifier circuit shown in FIG. 1, but embodiments are not limited thereto.

The circuit 612 including first and second driver devices 608A and 608B and a VMOSFET power device 610 according to an embodiment. The circuit 612 further includes a source plane 604 and a drain plane 606 each comprising am electrically conductive material.

The first and second driver devices 608A and 608B may each include electrical circuitry corresponding to that shown for the driver device 408 of FIG. 4, and together may correspond to either the driver circuit 208H or the driver circuit 208L of FIG. 2. The VMOSFET power device 610 may include electrical circuitry corresponding to that shown for the VMOSFET power device 310 of FIG. 3, and may correspond to the switching device 210H or the switching device 210L of FIG. 2.

The circuit 612 differs from the circuit 512 of FIG. 5A in that:

traces and vias (for example, photolithography-formed copper conductors deposited on polyimide, or the like) or stripline are used instead of bond wires to connect the first and second driver devices 608A and 608B to the VMOSFET power device 610, and gate and source pads of the VMOSFET power device 610 are positioned on the periphery of the VMOSFET power device 610, instead of being over the active regions of the VMOSFET power device 610.

Accordingly, first, second, third, and fourth left gate pads G11, G12, G13, and G14 of the VMOSFET power device 610 are respectively connected (by respective traces or stripline) to first, second, third, and fourth gate outputs GO1, GO2, GO3, and GO4 of the first driver device 608A. First, second, third, and fourth left source pads S11, S12, S13, and S14 are respectively electrically connected (by respective traces or striplines) to first, second, third, and fourth Kelvin source connections KS1, KS2, KS3, and KS4 of the first driver device 608A and (by different respective traces or striplines) to source plane 604. For example, in circuit 612, the fourth left source pad S14 is connected to the fourth Kelvin source connection KS4 of the first driver device 608A by a left Kelvin connection stripline 622A, and is connected to the source plane 604 by a left source connection stripline 624A.

In contrast, first, second, third, and fourth right gate pads G21, G22, G23, and G24 of the VMOSFET power device 610 are respectively connected (by respective traces or striplines) to fourth, third, second, and first gate outputs GO4, GO3, GO2, and GO1 of the second driver device 608B. Similarly, first, second, third, and fourth right source pads S21, S22, S23, and S24 of the VMOSFET power device 610 are respectively electrically connected (by respective traces or striplines) to fourth, third, second, and first Kelvin source connections KS4, KS3, KS2, and KS1 of the second driver device 608B and (by different respective traces or striplines) to source plane 604. For example, in circuit 612, the fourth right source pad S24 is connected to the first Kelvin source connection KS1 of the second driver device 608B by a right Kelvin connection stripline 622B, and connected to the source plane 604 by a right source connection stripline 624B.

A drain connection on the bottom of the VMOSFET power device 610 (not shown) is electrically connected to the drain plane 606. Power supply connections and connection to the input terminals of the first and second driver devices 608A and 608B are not shown in the interest of clarity.

The gate outputs GO1 through GO4 of each of the first and second driver devices 608A and 608B are vertically spaced according to a first pitch $\Phi 1$. The Kelvin source connections KS0 to KS4 of each of the first and second driver devices 608A and 608B may also be vertically spaced according to the first pitch $\Phi 1$.

The left gate pads G11 through G14 of the VMOSFET power device 610 are vertically spaced according to a second pitch $\Phi 2$. The right gate pads G21 through G24 are also vertically spaced according to the second pitch $\Phi 2$. The left source pads S11 through S14 may also be vertically spaced according to the second pitch $\Phi 2$, and the right source pads S21 through S24 may also be vertically spaced according to the second pitch $\Phi 2$.

The first pitch $\Phi 1$ may be related to the second pitch $\Phi 2$ as described with respect to FIG. 5A, and accordingly the advantageous reduction in the magnitude and variation of the parasitic inductances of the connections between the first and second driver devices 608A and 608B and the VMOSFET power device 610 may be realized, as described with respect to FIG. 5A.

Figure 6B:
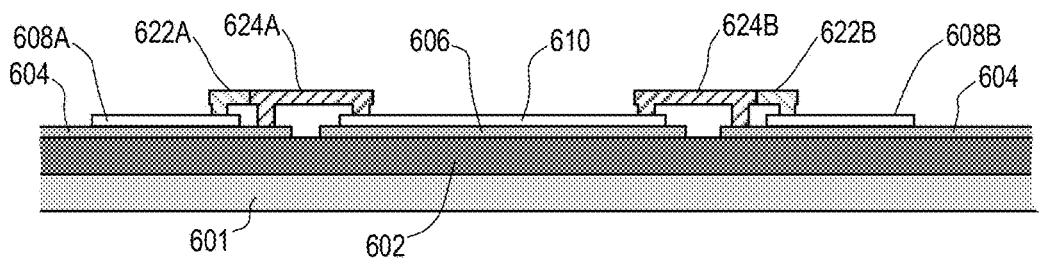
FIG. 6B illustrates a cross-section of the circuit shown in FIG. 6A according to an embodiment.

FIG. 6B illustrates a cross-section of the first and second driver devices 608A and 608B coupled to the VMOSFET power device 610 shown in FIG. 6A according to an embodiment.

The first and second driver devices 608A and 608B are mounted on the source plane 604, and the VMOSFET power device 610 is mounted on the drain plane 606. The source plane 604 and the drain plane 606 are disposed on an electrically insulating layer 602 of a circuit board. In the illustrated embodiment, the electrically insulating layer 602 comprises beryllium oxide (BeO), which has high thermal conductivity, but embodiments are not limited thereto.

The electrically insulating layer 602 may be disposed on a base plate 601 having high electrical and thermal conductivity. In the illustrated embodiment, the base plate 601 comprises copper (Cu), but embodiments are not limited thereto.

Stripline or traces and vias may be formed to electrically connect the first and second driver devices 608A and 608B, the VMOSFET power device 610, and the source plane 604, as described with respect to FIG. 6A. An insulating layer such as polyimide (not shown) may support the traces.

The circuit 612 reduces parasitic properties (such as parasitic inductance) that may reduce performance of the circuit 612 by:

1. providing multiple source pads S11 through S14 and S21 through S24 for the VMOSFET power device 610, connecting them using a first plurality of conductors to a nearby virtual ground comprising the source plane 604, and connecting them using a second plurality of conductors to the Kelvin source connections KS1 through KS4 of the nearest of the left and right driver devices 608A and 608B to minimize parasitic inductances of the source connections, 2. by providing multiple gate pads G11 through G14 and G21 through G24 for the VMOSFET power device 610 and connecting them to respective gate outputs GO1 through GO4 of the nearest of the left and right driver devices 608A and 608B to minimize parasitic inductances of the gate connections, 3. disposing the left source pads S11 through S14 and the left gate pads G11 through G14 on the left side of the VMOSFET power device 610 and connecting them to the left driver device 608A disposed adjacent to the left side of the VMOSFET power device 610, and disposing the right source pads S21 through S24 and the right gate pads G21 through G24 on the right side of the VMOSFET power device 610 and connecting them to the right driver device 608B disposed adjacent to the right side of the VMOSFET power device 610 to minimize parasitic inductances of the gate and source connections and to minimize parasitic inductances internal to the VMOSFET power device 610.

4. matching pad pitches of the left and right driver devices 608A and 608B and the VMOSFET power device 610 to reduce the parasitic inductances, and to reduce the variation among the parasitic inductances so that the cells of the VMOSFET power device 610 operate more consistently.

By using these features, embodiments may achieve the advantages described with respect to the circuit 512 of FIGS. 5A and 5B.

Figure 7A:
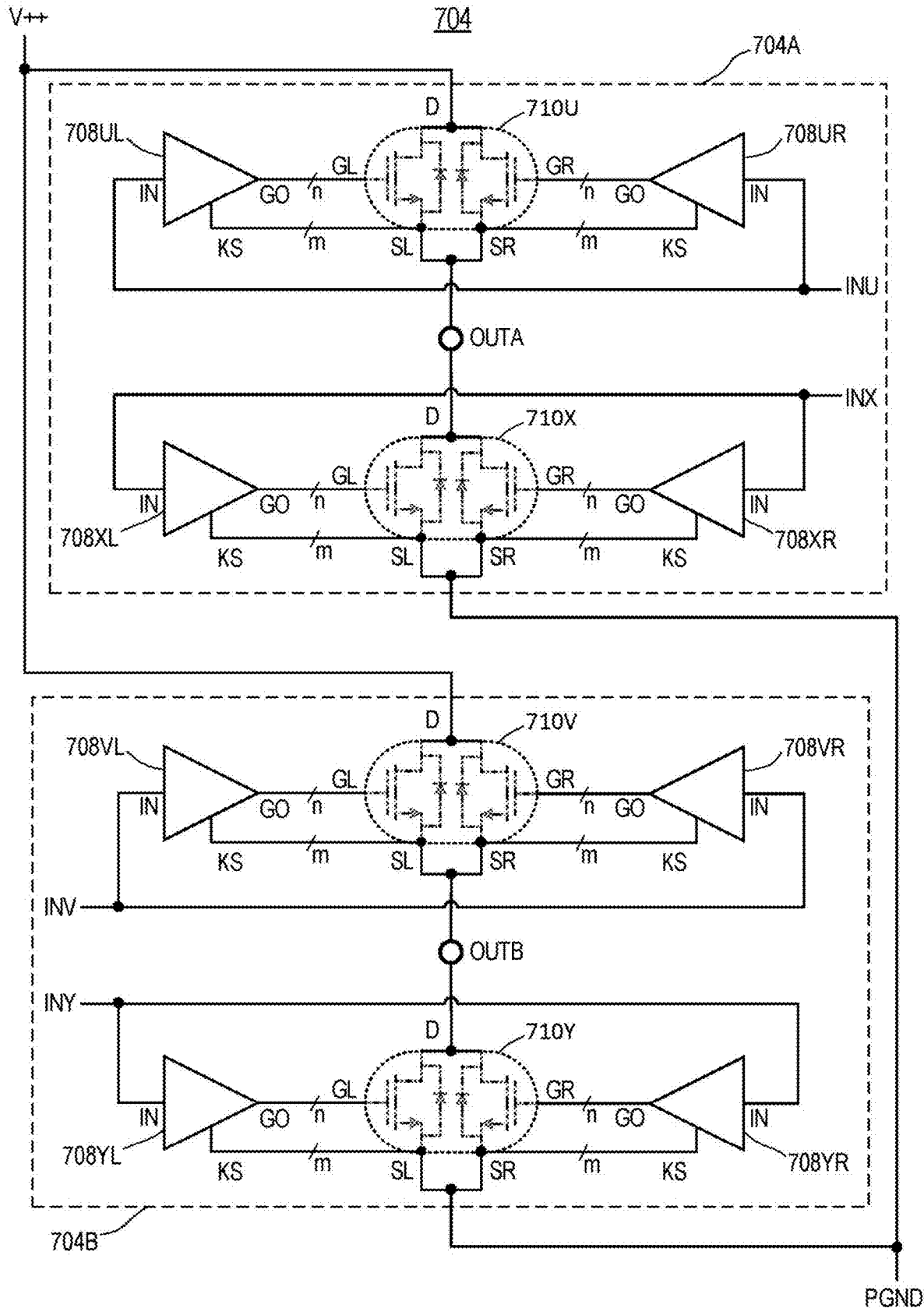
FIG. 7A illustrates an output stage circuit of a full-bridge class D amplifier circuit according to an embodiment.

FIG. 7A illustrates an output stage circuit 704 of a full-bridge class D amplifier according to an embodiment. The output stage circuit 704 includes first and second half-bridge circuits 704A and 704B that may respectively correspond to the first and second half-bridge circuits 104A and 104B of FIG. 1.

The output stage circuit 704 may comprise four multi-cell power devices each corresponding to one of the four legs of a full-bridge amplifier: first power device 710U, second power device 710V, third power device 710X, and fourth power device 710Y. Collectively these may be referred to as power devices 710. A multi-cell power device is a power device fabricated with one or more "tubs" that include a plurality of cells that each contribute to the operation of the multi-cell power device, that may each be identical, that may each receive an identical input stimulus, and that may each be operated in the same manner in order to provide the functionality of the multi-cell power device. In embodiments, the identical input stimulus provided to each cell in a tub may be provided using a different signal to different cells of the tub. This approach provides unmatched redundancy and reliability to the class D power amplifier, as the Class D power amplifier may continue to operate satisfactory even in the event of a failure of one or more tubs (i.e., cells) of the first through fourth power devices 710U through 710Y, until a flag signal is sent to the controlling system.

In the embodiment of FIG. 7A, each of the first, second, third, and fourth power devices 710U, 710V, 710X, and 710Y is a multi-cell SiC VMOSFET with an integrated SiC SBD, wherein each of the two MOSFETs and associated diodes illustrated within the envelope of each device respectively representing a plurality of MOSFET/diode cells, as illustrated in FIG. 3 or FIG. 6. However, embodiments are not limited thereto.

The first, second, third, and fourth power devices 710U, 710V, 710X, and 710Y may each correspond to the VMOSFET power device 610 of FIG. 6.

Accordingly, the first power devices 710U may include a first plurality of active regions disposed on a left half of the first power devices 710U. Each active region of the first plurality of active regions respectively includes a cell of the first power devices 710U; here where the first power devices 710U is a multi-cell SiC VMOSFET with an integrated SiC SBD, each cell may include a SiC VMOSFET and a SiC SBD. The first plurality of active regions has a first plurality of respective control terminal contacts (here, first through $n^{th}$ left gate pads) disposed on the left half of the first power devices 710U and a plurality of respective first conduction terminal contacts (here, first through $m^{th}$ left source pads) disposed on the left half of the first power devices 710U. In an embodiments, n is equal to the number of active regions in the first plurality of active regions, and m is equal to or greater than the number of active regions in the first plurality of active regions.

The first power devices 710U may further include a second plurality of active regions disposed on a right half of the first power devices 710U. Each active region of the second plurality of active regions respectively includes a cell of the first power devices 710U; here where the first power devices 710U is a multi-cell SiC VMOSFET with an integrated SiC SBD, each cell may include a SiC VMOSFET and a SiC SBD. The second plurality of active regions has a second plurality of respective control terminal contacts (here, first through $n^{th}$ right gate pads) disposed on the right half of the first power devices 710U and a second plurality of respective first conduction terminal contacts (here, first through $m^{th}$ right source pads) disposed on the right half of the first power devices 710U.

Respective second conduction terminals of the first and second plurality of active regions, which may correspond to drains of MOSFETs included therein, are coupled to a common drain pad D.

The second, third, and fourth power devices 710V, 710X, and 710Y may be configured as described for the first power devices 710U.

The output stage circuit 704 may further comprise four pairs of driver devices: left and right first driver devices 708UL and 708UR associated with the first power device 710U, left and right second driver devices 708VL and 708VR associated with the second power device 710V, left and right third driver devices 708XL and 708XR associated with the third power device 710X, and left and right fourth driver devices 708YL and 708YR associated with the fourth power device 710Y. Collectively these may be referred to as driver devices 708. The left driver devices 708UL, 708VL, 708XL, and 708YL may each correspond to the first driver device 608A of FIG. 6A. The right driver devices 708UR, 708VR, 708XR, and 708YR may each correspond to the second driver device 608B of FIG. 6A.

The left and right first driver devices 708UL and 708UR, first power device 710U, left and right third driver devices 708XL and 708XR, and the third power device 710X comprise the first half-bridge circuit 704A. The left and right second driver devices 708VL and 708VR, second power device 710V, left and right fourth driver devices 708YL and 708YR, and fourth power device 710Y comprise the second half-bridge circuit 704B.

Each of the driver devices 708 includes a plurality of subdriver circuits having respective inputs commonly electrically coupled to an input signal IN, respective outputs respectively electrically coupled to a plurality of gate outputs GO, and respective Kelvin connections respectively electrically coupled to a plurality of Kelvin source connections KS. In an embodiment, each of the driver devices 708 comprises first through $n^{th}$ gate outputs GO and first through $m^{th}$ Kelvin source connections KS, where n is the number of gate pads disposed on one half of the corresponding one of the power devices 710, and m is number of source pads disposed on one half of the corresponding one of the power devices 710.

Regarding the first half-bridge circuit 704A, the first through $n^{th}$ gate outputs GO of the left first driver device 708UL may be respectively electrically coupled to the first through $n^{th}$ left gate pads of the first power device 710U, and the first through $m^{th}$ Kelvin source connections KS of the left first driver device 708UL may be respectively electrically coupled to the first through $m^{th}$ left source pads of the first power device 710U.

In one embodiment, the right first driver device 708UR may be similarly connected to the first power device 710U, with the first through $n^{th}$ gate outputs GO of the right first driver device 708UR respectively electrically coupled to the first through $n^{th}$ right gate pads of the first power device 710U, and the first through $m^{th}$ Kelvin source connections KS of the right first driver device 708UL respectively electrically coupled to the first through $m^{th}$ right source pads of the first power device 710U.

In another embodiment, the right first driver device 708UR is connected in inverse fashion to the first power device 710U, with the first through $n^{th}$ gate outputs GO of the right first driver device 708UR respectively electrically coupled to the $n^{th}$ through first right gate pads of the first power device 710U, and the first through $m^{th}$ Kelvin source connections KS of the right first driver device 708UL respectively electrically coupled to the $m^{th}$ through first right source pads of the first power device 710U.

The left and right third driver devices 708XL and 708XR may be electrically coupled to the third power device 710X as described above for the left and right first driver devices 708UL and 708UR and the first power device 710U.

The drain pad D of the first power device 710U is electrically coupled to the power supply V++. The first to $m^{th}$ left source pads and first to $m^{th}$ right source pads of the first power device 710U are commonly coupled to the first amplifier output OUTA.

The drain pad D of the third power device 710X is electrically coupled to the first amplifier output OUTA. The first to $m^{th}$ left source pads and first to $m^{th}$ right source pads of the third power device 710X are commonly coupled to the power ground PGND.

Regarding the second half-bridge circuit 704B, the left and right second driver devices 708VL and 708VR may be electrically coupled to the second power device 710V in the manner described above for the left and right first driver devices 708UL and 708UR and first power device 710U, and the left and right fourth driver devices 708YL and 708YR may be electrically coupled to the fourth power device 710Y in the manner described above for the left and right third driver devices 708XL and 708XR and the third power device 710X, except that the first to $m^{th}$ left source pads and first to $m^{th}$ right source pads of the second power device 710V are commonly coupled to the second amplifier output OUTB and the drain pad D of the fourth power device 710Y is electrically coupled to the second amplifier output B.

The left and right first driver devices 708UL and 708UR receive a first input signal INU at their respective inputs IN. The left and right second driver devices 708VL and 708VR receive a second input signal INV at their respective inputs IN. The left and right third driver devices 708XL and 708XR receive a third input signal INX at their respective inputs IN. The left and right fourth driver devices 708YL and 708YR receive a fourth input signal INY at their respective inputs IN.

The first, second, third, and fourth input signals INU, INV, INX, and INY may be controlled so that the first and fourth input signals INU and INY may be asserted and deasserted together and the second and third input signals INV and INX may be asserted and deasserted together. Accordingly, the output stage circuit 704 may be controlled to source current to the first amplifier output OUTA and sink current from the second amplifier output OUTB when the first and fourth input signals INU and INY are asserted, and to source current to the second amplifier output OUTB and sink current from the first amplifier output OUTA when the second and third input signals INV and INX are asserted.

Figure 7B:
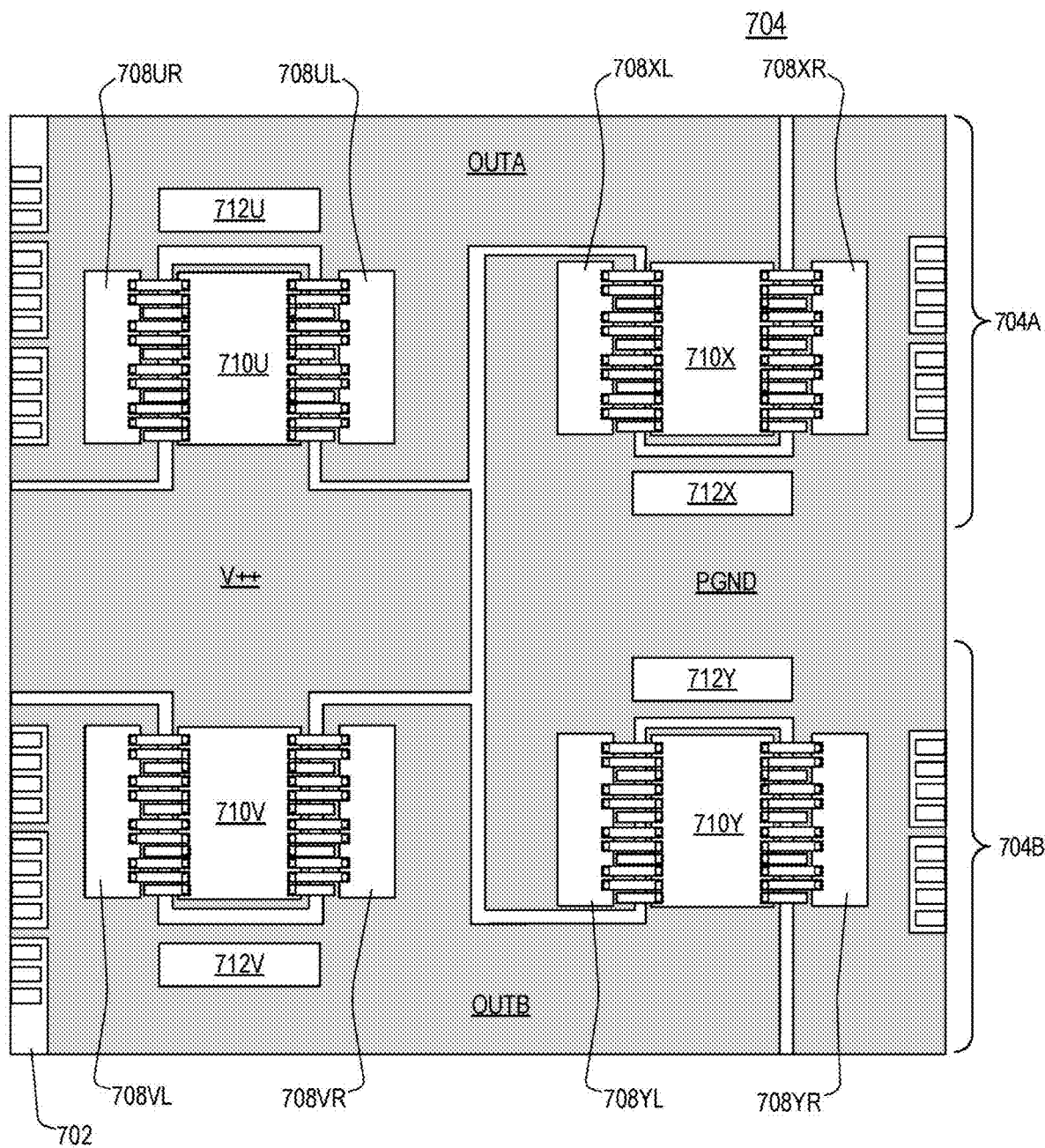
FIG. 7B illustrates a plan view of the output stage circuit of FIG. 7A according to an embodiment.

FIG. 7B illustrates a plan view of the output stage circuit 704 according to an embodiment. Like the circuit 512 of FIGS. 5A and 5B and the circuit 612 of FIGS. 6A and 6B, the output stage circuit 704 is disposed on an electrically insulating layer 702 of a circuit board.

The left and right first driver devices 708UL and 708UR are disposed on left and right sides of the first power device 710U, respectively. Gate outputs and Kelvin source connections of the left first driver device 708UL are electrically connected by striplines to left gate pads and left source pads, respectively, disposed on the left side of the first power device 710U. Gate outputs and Kelvin source connections of the right first driver device 708UL are connected by striplines to right gate pads and right source pads, respectively, disposed on the right side of the first power device 710U.

The left and right second driver devices 708VL and 708VR are disposed on left and right sides of the second power device 710V, respectively, and are electrically connected as described for the left and right first driver devices 708UL and 708UR and the first power device 710U, above.

The left and right third driver devices 708XL and 708XR are disposed on left and right sides of the third power device 710X, respectively, and are electrically connected as described for the left and right first driver devices 708UL and 708UR and the first power device 710U, above.

The left and right fourth driver devices 708YL and 708YR are disposed on left and right sides of the fourth power device 710Y, respectively, and are electrically connected as described for the left and right first driver devices 708UL and 708UR and the first power device 710U, above.

The left source pads and right source pads of the first power device 710U are also electrically connected, using conductors not used to connect the left source pads and right source pads to their respective Kelvin source connections, to a first output pad OUTA comprising electrically conductive material and corresponding to the first amplifier output A. A drain pad on the bottom of the first power device 710U is electrically connected to a power supply pad V++ comprising electrically conductive material.

The left source pads and right source pads of the second power device 710V are also electrically connected, using conductors not used to connect the left source pads and right source pads to their respective Kelvin source connections, to a second output pad OUTB comprising electrically conductive material and corresponding to the second amplifier output B. A drain pad on the bottom of the second power device 710V is electrically connected to the power supply pad V++.

The left source pads and right source pads of the third power device 710X are also electrically connected, using conductors not used to connect the left source pads and right source pads to their respective Kelvin source connections, to a ground pad PGND comprising electrically conductive material. A drain pad on the bottom of the third power device 710X is electrically connected to the first output pad OUTA.

The left source pads and right source pads of the fourth power device 710Y are also electrically connected, using conductors not used to connect the left source pads and right source pads to their respective Kelvin source connections, to the ground pad PGND. A drain pad on the bottom of the fourth power device 710Y is electrically connected to the second output pad OUTB.

Also shown in FIG. 7B are first, second, third, and fourth controller circuits 712U, 712V, 712X, and 712Y. The first through fourth controller circuits 712U through 712Y may provide some or all of the functionality of the controller circuit 102 of FIG. 1. The first controller circuits 712U controls the left and right first driver devices 708UL and 708UR, the second controller circuit 712V controls the left and right second driver devices 708VL and 708VR, the third controller circuit 712X controls the left and right third driver devices 708XL and 708XR, and the fourth controller circuit 712Y controls the left and right fourth driver devices 708YL and 708YR. Connections between the controller circuits and their respective pairs of driver devices are not shown in FIG. 7B.

In an embodiment wherein the power devices 710U through 710X are multi-cell power devices comprising a plurality of cells and the driver devices 708UL through 708YR provide different gate output signals GO to each of the plurality of cells, the first through fourth controller circuits 712U through 712Y may be configured to exploit the redundancy within the power devices 710U through 710X so that the amplifier 704 may continue to operate even if one or more cells are or become defective. For example, the first through fourth controller circuits 712U through 712Y may be configured to disable a defective cell among the plurality of cells using the gate output signal GO corresponding to that cell.

Not shown in the interest of clarity is the electrical wiring for the inputs signals INU, INV, INX and INY or the power supplies for the driver devices 708.

Each of the four legs of the output stage circuit 704 is configured similarly to the circuit 612 described with respect to FIGS. 6A and 6B, and accordingly each of the four legs of the output stage circuit 704 obtains the benefits described with respect to the circuit 612.

Illustrative embodiments have been provided wherein legs of a full-bridge class-D amplifier respectively comprise power devices and respective associated pluralities of driver devices, the power devices having a plurality of active regions each with respective gate pads and source pads connected to gate outputs and Kelvin source connections of the respective plurality of device drivers using wire bonds or striplines. However, embodiments not limited thereto. For example, in embodiments, the gate pads and source pads of the power devices may be connected to corresponding gate outputs and Kelvin source pads of the associated plurality of driver devices using wire bonds, stripline, printed circuit traces, flip-chip technology, through-silicon vias, or combinations thereof.

The illustrative embodiments disclosed herein show two driver devices disposed adjacent to opposite sides of a corresponding switching device that they are connected to, but embodiments are not limited thereto. For example, in embodiments, the two driver devices may be disposed adjacent to respective sides of the corresponding switching device that are not opposite to each other. For another example, in embodiments, three or more driver devices may be disposed adjacent to respective sides of the corresponding switching device, each connected to pads disposed on the switching device near their respective side.

Aspects of the present disclosure have been described in conjunction with the specific embodiments that are presented as illustrative examples. Numerous alternatives, modifications, and variations to the disclosed embodiments may be made without departing from the scope of the claims set forth below. Embodiments disclosed herein are not intended to be limiting.

Unless otherwise, when an element is described as being coupled or connected to another element, coupled means an electrical coupling and connected means an electrical connection.

What is claimed is:
1. A class-D amplifier circuit, comprising:
a circuit board;
a first amplifier output;
a second amplifier output;
a first power device disposed on the circuit board and comprising a left control terminal, a right control terminal, and first and second conduction terminals;
a second power device disposed on the circuit board and comprising first and second conduction terminals;
a third power device disposed on the circuit board and comprising first and second conduction terminals;
a fourth power device disposed on the circuit board and comprising first and second conduction terminals;
a first left driver device disposed adjacent to the left side of the first power device and coupled to the left control terminal of the first power device;
a first right driver device disposed adjacent to the right side of the first power device and coupled to the right control terminal of the first power device,
wherein the first conduction terminal of the first power device and the first conduction terminal of the third power device are coupled to a first power supply voltage,
wherein the second conduction terminal of the first power device and the first conduction terminal of the second power device are coupled to the first amplifier output,
wherein the second conduction terminal of the second power device and the second conduction terminal of the fourth power device are coupled to a second power supply voltage,
wherein the second conduction terminal of the third power device and the first conduction terminal of the fourth power device are coupled to the second amplifier output,
wherein the first power device is a multi-tub power device comprises:
a drain contact corresponding to the first conduction terminal of the first power device;
a plurality of left gate contacts disposed on a left half of the first power device, wherein one of the left gate contacts corresponds to the left control terminal of the first power device;
a plurality of left source contacts disposed on the left half of the first power device;
a plurality of right gate contacts disposed on a right half of the first power device, wherein one of the right gate contacts corresponds to the right control terminal of the first power device; and
a plurality of right source contacts disposed on the right half of the first power device,
wherein at least one of the plurality of left source contacts or the plurality of right source contacts corresponds to the second conduction terminal of the first power device, and
wherein the plurality of left source contacts and the plurality of right source contacts are all coupled to the first amplifier output,
wherein the first left driver device comprises a plurality of Kelvin source connections,
wherein the first right driver device comprises a plurality of Kelvin source connections,
wherein the plurality of left source contacts of the first power device are coupled to the plurality of Kelvin source connections of the first left driver device, and
wherein the plurality of right source contacts of the first power device are coupled to the plurality of Kelvin source connections of the first right driver device.
2. The amplifier circuit of claim 1, wherein each of the left source contacts of the first power device is respectively connected to a corresponding Kelvin source connection of the first left driver device.

3. The amplifier circuit of claim 1,
wherein the first left driver device comprises a plurality of gate outputs,
wherein the first right driver device comprises a plurality of gate outputs,
wherein the plurality of left gate contacts of the first power device are coupled to the plurality of gate outputs of the first left driver device, and
wherein the plurality of right gate contacts of the first power device are coupled to the plurality of gate outputs of the first right driver device.

4. The amplifier circuit of claim 3, wherein each of the left gate contacts of the first power device is respectively connected to a corresponding gate output of the first left driver device.

5. The amplifier circuit of claim 3, wherein the first left driver device comprises a plurality of subdrivers respectively producing the gate outputs of the first left driver device, and
wherein inputs of the plurality of subdrivers are all coupled to an input of the first left driver device.

6. The amplifier circuit of claim 1,
wherein the first power device is a silicon carbide power device comprising:
a plurality of left active regions having a first total area and disposed on the left half of the first power device,
a plurality of right active regions having a second total area and disposed on the right half of the first power device,
a plurality of inactive regions, the one or more inactive regions having a third total area,
wherein the third total area is greater than or equal to a sum of the first active area and the second active area.

7. The amplifier circuit of claim 6, wherein within the first power device:
the drain contact is connected to each of the left and right active regions,
the plurality of left gate contacts are respectively connected to the plurality of left active regions,
the plurality of right gate contacts are respectively connected to the plurality of right active regions,
the plurality of left source contacts are respectively connected to the plurality of left active regions, and
the plurality of left source contacts are respectively connected to the plurality of right active regions.

8. The amplifier circuit of claim 7, wherein the first power device comprises a Metal-Oxide-Semiconductor Field Effect Transistor (MOSFET), and
wherein each of the left and right active regions comprises a cell of the MOSFET.

9. The amplifier circuit of claim 8, wherein the MOSFET is a Vertical MOSFET.

10. The amplifier circuit of claim 8, wherein each of the left and right active regions comprises a Schottky Barrier Diode (SBD).

11. The amplifier circuit of claim 10, wherein the SBDs are monolithically integrated SBDs internal to the cell of the MOSFET of their respective active regions.

12. The amplifier circuit of claim 10, wherein the SBDs are external to the cell of the MOSFET of their respective active regions.

13. The amplifier circuit of claim 6,
wherein the first left driver device comprises a plurality of gate outputs,
wherein the plurality of left gate contacts of the first power device are coupled to the plurality of gate outputs of the first left driver device,
wherein a first pitch corresponding to a separation along a direction between adjacent left gate contacts of the first power device is within plus or minus twenty percent of a second pitch corresponding to a separation along the direction between adjacent left gate outputs of the first left driver device.

14. The amplifier circuit of claim 13,
wherein a third pitch corresponding to a separation along the direction between adjacent left source contacts is substantially equal to the first pitch, and
wherein a fourth pitch corresponding to a separation along the direction between adjacent Kelvin source connections of the first left driver device is substantially equal to the second pitch or substantially equal to the third pitch.

15. The amplifier circuit of claim 1, further comprising a low pass filter circuit coupled to the first amplifier output.

16. A class-D amplifier circuit, comprising:
a circuit board;
a first amplifier output;
a second amplifier output;
a first power device disposed on the circuit board and comprising a left control terminal, a right control terminal, and first and second conduction terminals;
a second power device disposed on the circuit board and comprising first and second conduction terminals;
a third power device disposed on the circuit board and comprising first and second conduction terminals;
a fourth power device disposed on the circuit board and comprising first and second conduction terminals;
a first left driver device disposed adjacent to the left side of the first power device and coupled to the left control terminal of the first power device;
a first right driver device disposed adjacent to the right side of the first power device and coupled to the right control terminal of the first power device,
wherein the first conduction terminal of the first power device and the first conduction terminal of the third power device are coupled to a first power supply voltage,
wherein the second conduction terminal of the first power device and the first conduction terminal of the second power device are coupled to the first amplifier output,
wherein the second conduction terminal of the second power device and the second conduction terminal of the fourth power device are coupled to a second power supply voltage,
wherein the second conduction terminal of the third power device and the first conduction terminal of the fourth power device are coupled to the second amplifier output,
wherein the fourth power device comprises a left control terminal and a right control terminal,
wherein the amplifier circuit comprises:
a second left driver device disposed adjacent to a left side of the fourth power device and connected to the left control terminal of the fourth power device, and
a second right driver device disposed adjacent to a right side of the fourth power device and connected to the right control terminal of the fourth power device,
further comprising a controller circuit comprising:
a first switch output coupled to respective inputs of the first left driver device, the first right driver device, the fourth left driver device, and the fourth right driver device; and a second switch output coupled to respective inputs of the second left driver device, the second right driver device, the third left driver device, and the third right driver device, wherein the controller circuit is configured to assert the first and second switch outputs according to an input signal received by the controller circuit, and to not assert both the first switch output and the second switch output at the same time.

17. The amplifier circuit of claim 16, further comprising a low pass filter circuit coupled to the first and second amplifier outputs.

18. The amplifier circuit of claim 1, comprising:
a controller circuit configured to control the first power device,
wherein the first power device is a Radio Frequency (RF) multi-cell power semiconductor comprising a plurality of cells, and
the controller circuit is configured to respectively control the plurality of cells to provide redundancy during operation of the amplifier circuit.

19. The amplifier circuit of claim 16,
wherein the first left driver device comprises a plurality of subdrivers, a plurality of gate outputs being respective outputs of the plurality of subdrivers, and a plurality of Kelvin source connections being respective Kelvin source connections of the plurality of subdrivers,
wherein the first power device comprises a plurality of left tubs, a plurality of left gate contacts of the first power device being respective gate contacts of the plurality of left tubs, and a plurality of left source contacts of the first power device being respective source contacts of the plurality of left tubs, the left control terminal of the first power device corresponding to one of the gate contacts of the plurality of left tubs, and
wherein the plurality of subdrivers respectively correspond to the plurality of left tubs, the outputs of each subdriver being coupled to the gate contact of a corresponding left tub, and the Kelvin source connections of each subdrivers being coupled to the source contact of the corresponding left tub.

20. The amplifier circuit of claim 3,
wherein the first left driver device comprises a plurality of subdrivers, the plurality of gate outputs of the first left driver device being respective outputs of the plurality of subdrivers, and the plurality of Kelvin source connections of the first left driver device being respective Kelvin source connections of the plurality of subdrivers,
wherein the first power device comprises a plurality of left tubs, the plurality of left gate contacts of the first power device being respective gate contacts of the plurality of left tubs, and the plurality of left source contacts of the first power device being respective source contacts of the plurality of left tubs, and
wherein the plurality of subdrivers respectively correspond to the plurality of left tubs, the outputs of each subdriver being coupled to the gate contact of a corresponding left tub, and the Kelvin source connections of each subdrivers being coupled to the source contact of the corresponding left tub.

21. The amplifier circuit of claim 1, further comprising a low pass filter circuit coupled to the first and second amplifier outputs.

* * * * *